(12) United States Patent
van de Ven et al.

(10) Patent No.: US 8,794,793 B2
(45) Date of Patent: Aug. 5, 2014

(54) SOLID STATE LIGHTING DEVICE WITH ELONGATED HEATSINK

(75) Inventors: Antony Paul van de Ven, Hong Kong (CN); Martin Bertock, legal representative, Brookvale (AU); Derek Ian Darley, Cromer (AU)

(73) Assignee: Cree, Inc., Durham, NC (US)

( * ) Notice: Subject to any disclaimer, the term of this patent is extended or adjusted under 35 U.S.C. 154(b) by 345 days.

(21) Appl. No.: 13/022,533

(22) Filed: Feb. 7, 2011

(65) Prior Publication Data

US 2012/0201022 A1    Aug. 9, 2012

(51) Int. Cl.
*F21S 4/00* (2006.01)
*F21V 21/00* (2006.01)

(52) U.S. Cl.
USPC . 362/249.02; 362/218; 362/294; 362/311.02; 362/800

(58) Field of Classification Search
USPC ............. 362/218, 249.02, 294, 311.02, 800
See application file for complete search history.

(56) References Cited

U.S. PATENT DOCUMENTS

| | | | |
|---|---|---|---|
| 6,158,882 A | 12/2000 | Bischoff | |
| 6,350,041 B1 | 2/2002 | Tarsa et al. | |
| 6,371,637 B1 | 4/2002 | Atchinson et al. | |
| 6,762,562 B2 | 7/2004 | Leong | |
| 6,871,993 B2 | 3/2005 | Hecht | |
| 7,210,818 B2 | 5/2007 | Luk et al. | |
| 7,234,844 B2 | 6/2007 | Bolta et al. | |
| 8,371,717 B2 * | 2/2013 | Lai ................................ 362/276 |
| 2004/0001344 A1 | 1/2004 | Hecht | |
| 2008/0037257 A1 | 2/2008 | Bolta | |
| 2008/0192462 A1 | 8/2008 | Steedly et al. | |
| 2008/0198598 A1 | 8/2008 | Ward | |
| 2009/0154156 A1 * | 6/2009 | Lo et al. ........................ 362/234 |
| 2010/0027293 A1 | 2/2010 | Li | |
| 2010/0110679 A1 * | 5/2010 | Teng et al. .................... 362/235 |
| 2010/0155746 A1 | 6/2010 | Ibbetson et al. | |

FOREIGN PATENT DOCUMENTS

| | | |
|---|---|---|
| AU | 2010-269264 A1 | 2/2012 |
| KR | 10-2006-0102796 A | 9/2006 |
| KR | 10-0938932 B1 | 1/2010 |
| KR | 10-20100126063 A | 12/2010 |

OTHER PUBLICATIONS

International Search Report and Written Opinion issued on Aug. 14, 2012 in corresponding International Patent Application No. PCT/US2012/023342.

* cited by examiner

*Primary Examiner* — Jason Moon Han
(74) *Attorney, Agent, or Firm* — Withrow & Terranova, P.L.L.C.; Vincent K. Gustafson

(57) ABSTRACT

Solid state lighting devices include elongated heatsinks with multiple raised features each including a major surface non-parallel to a longitudinal direction of the heatsink. A device-scale heatsink including raised features may include at least a portion of a threaded rod or tube, with threads thereof forming the raised features. Raised features may also be formed by stamped and bent emitter support elements arranged to support solid state light emitters, with the emitter support elements inserted into recesses of an elongated heatsink body.

37 Claims, 7 Drawing Sheets

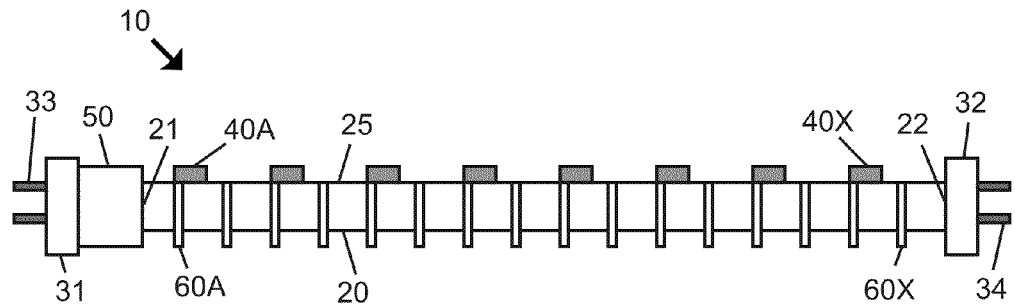
FIG._1A
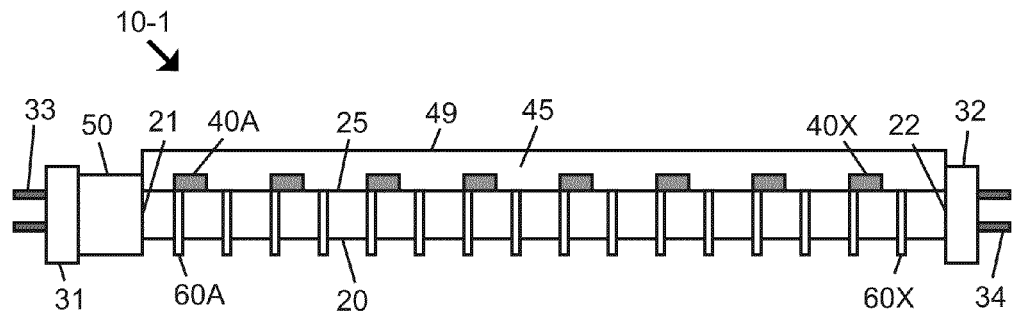
FIG._1B
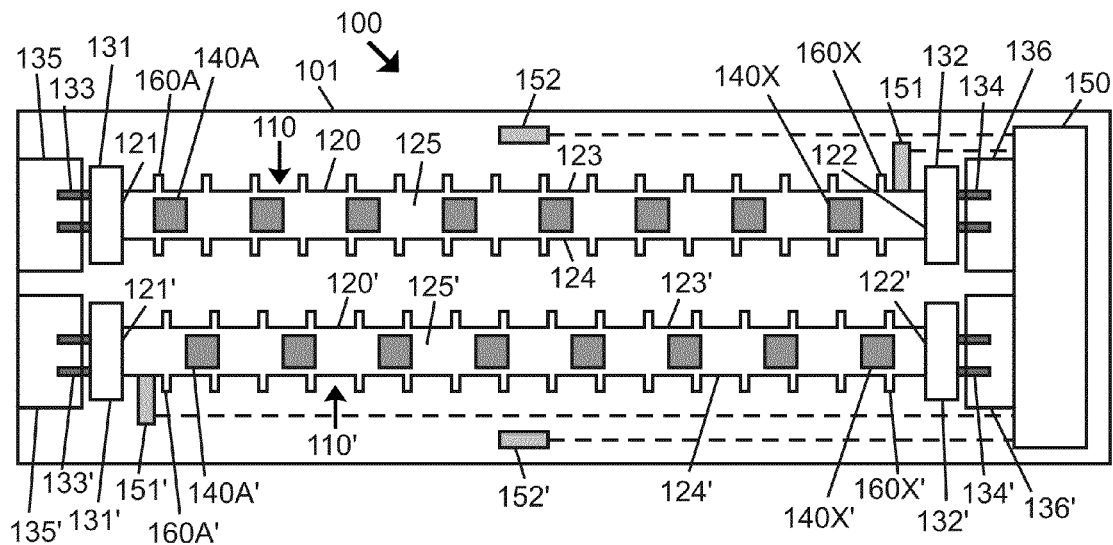
FIG._2

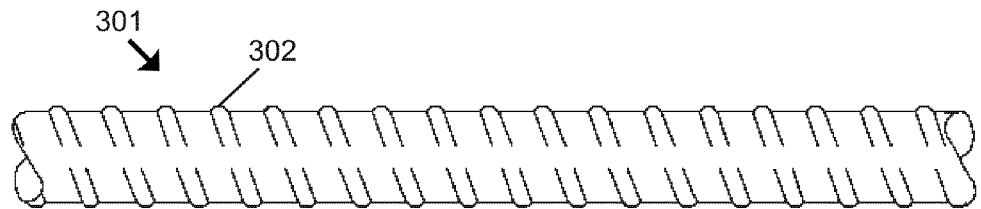
FIG._3A
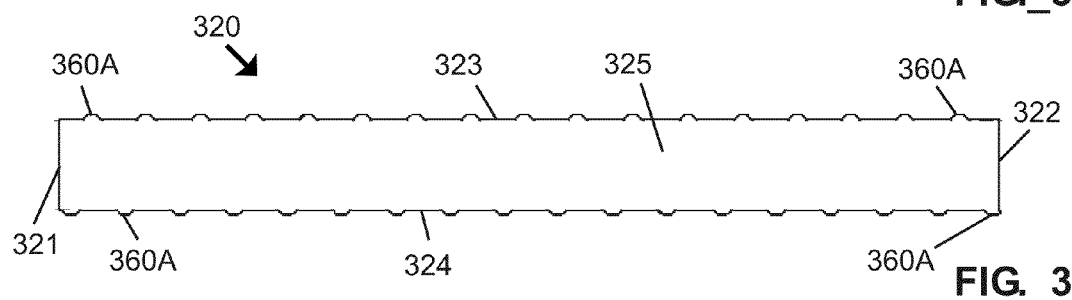
FIG._3B
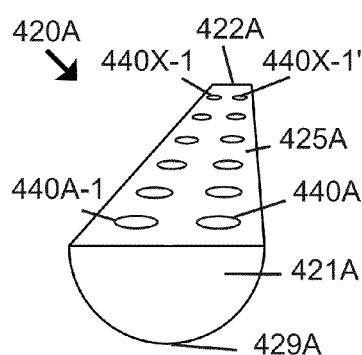
FIG._4A
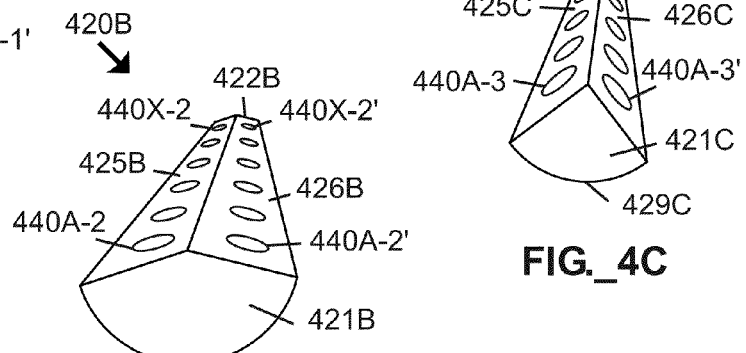
FIG._4B
FIG._4C
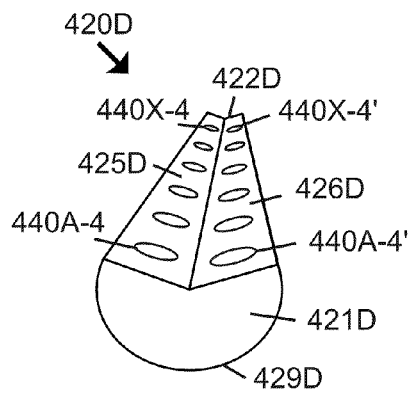
FIG._4D
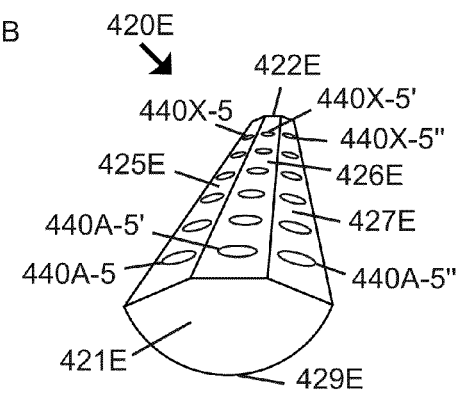
FIG._4E

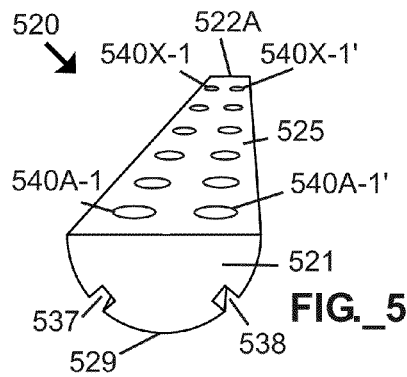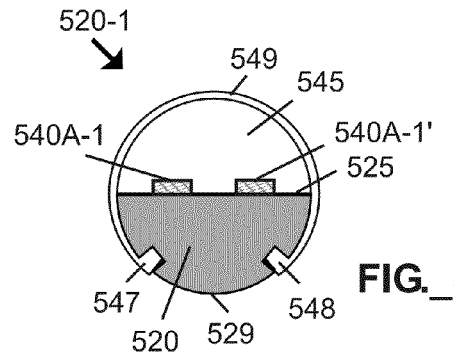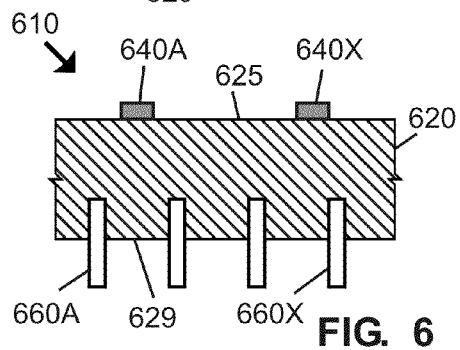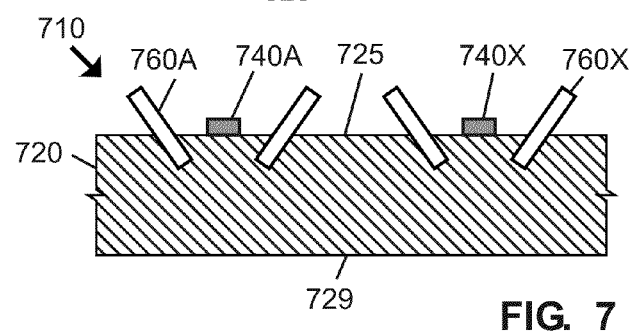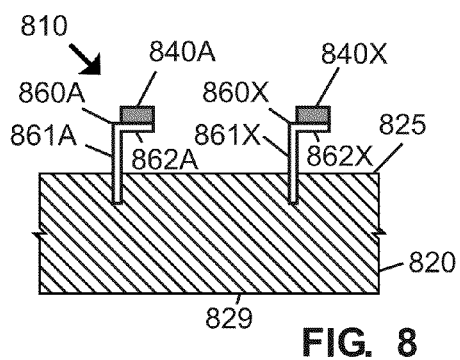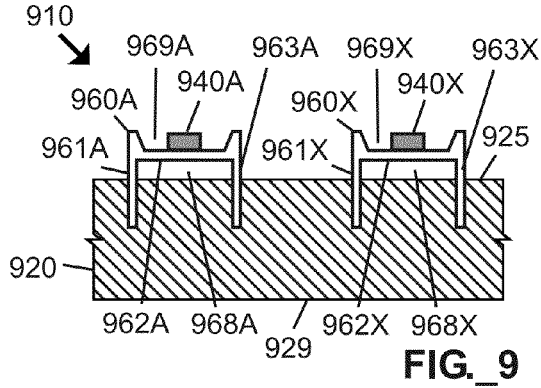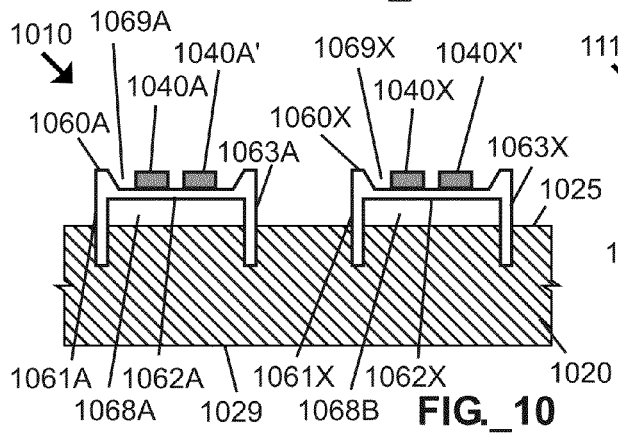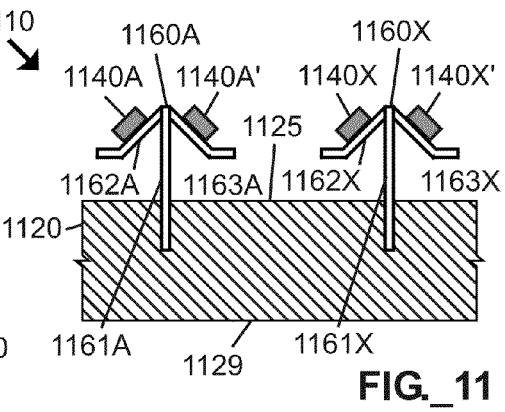

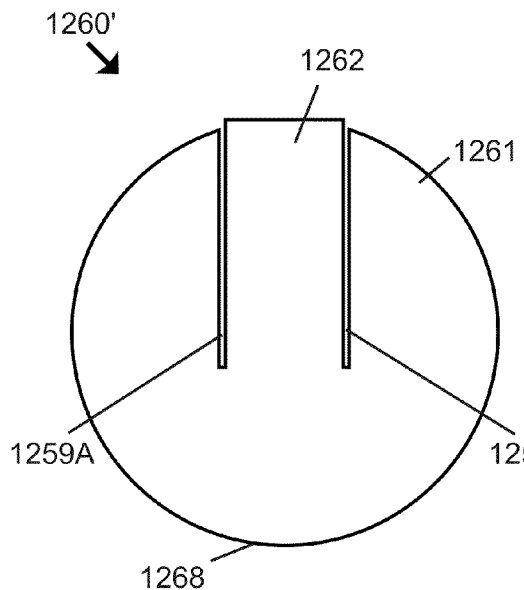
FIG._12A
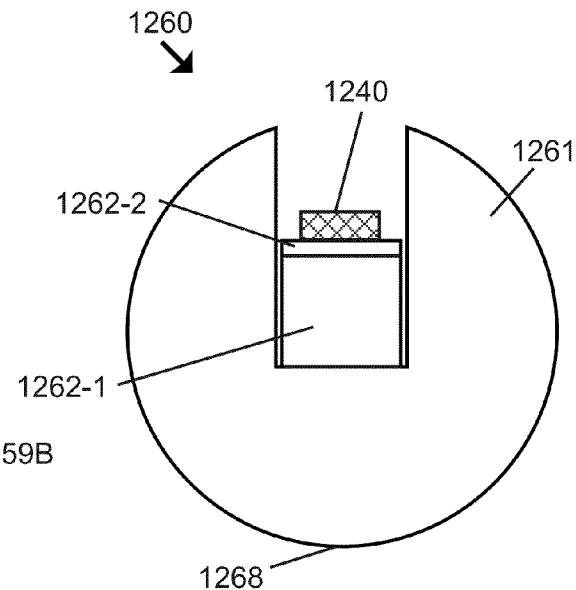
FIG._12B
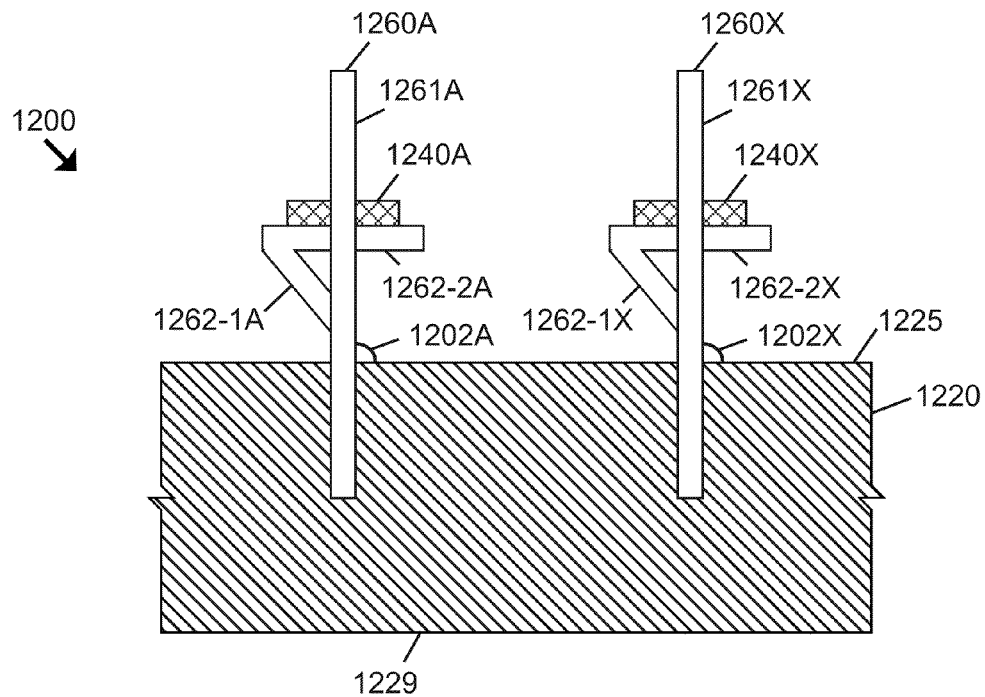
FIG._12C

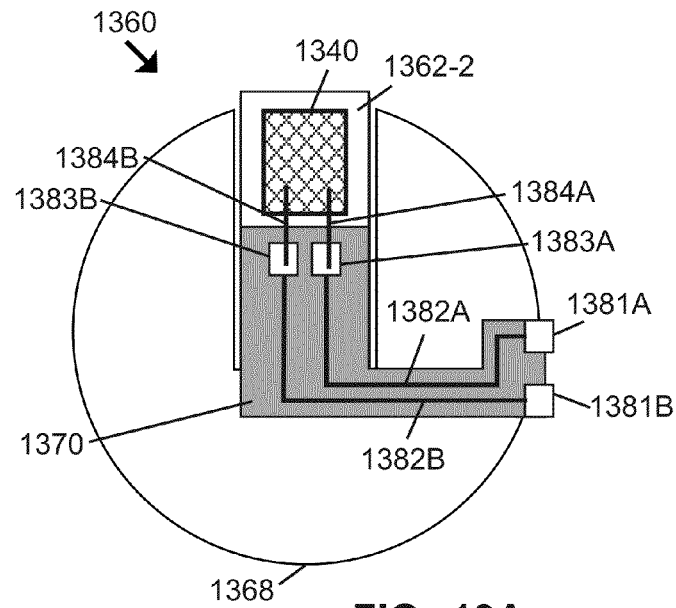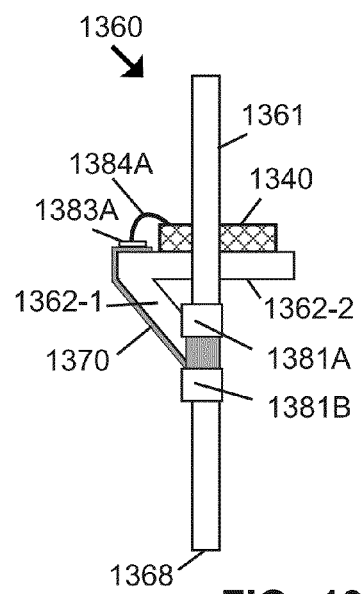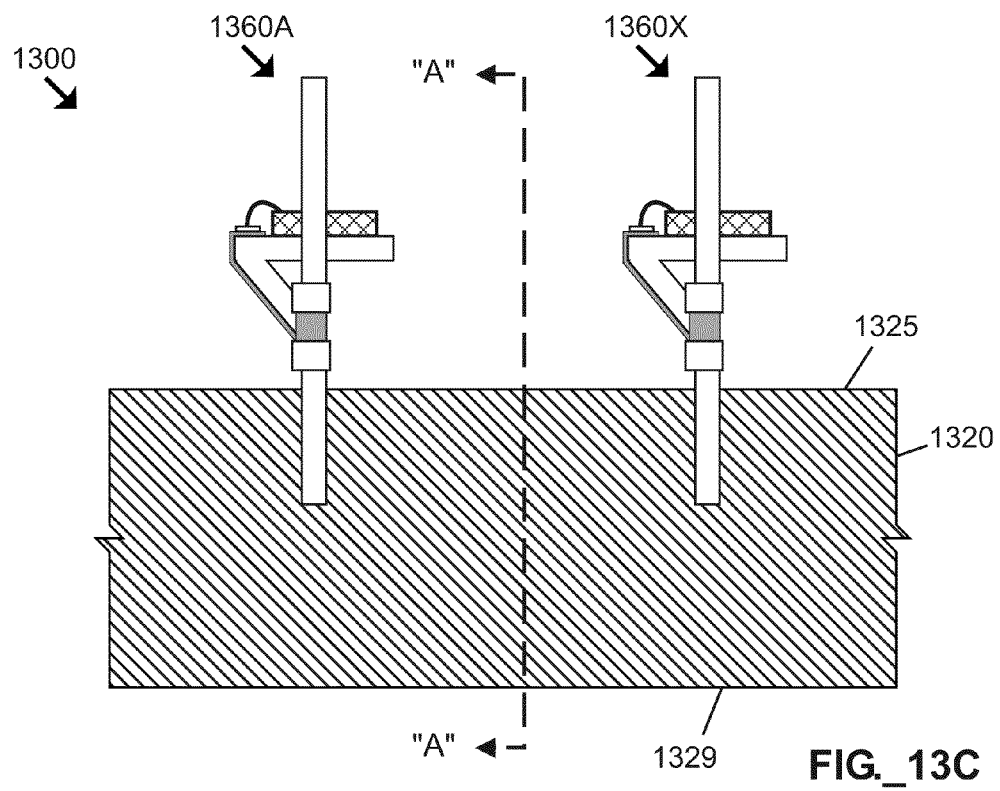
FIG._13A
FIG._13B
FIG._13C

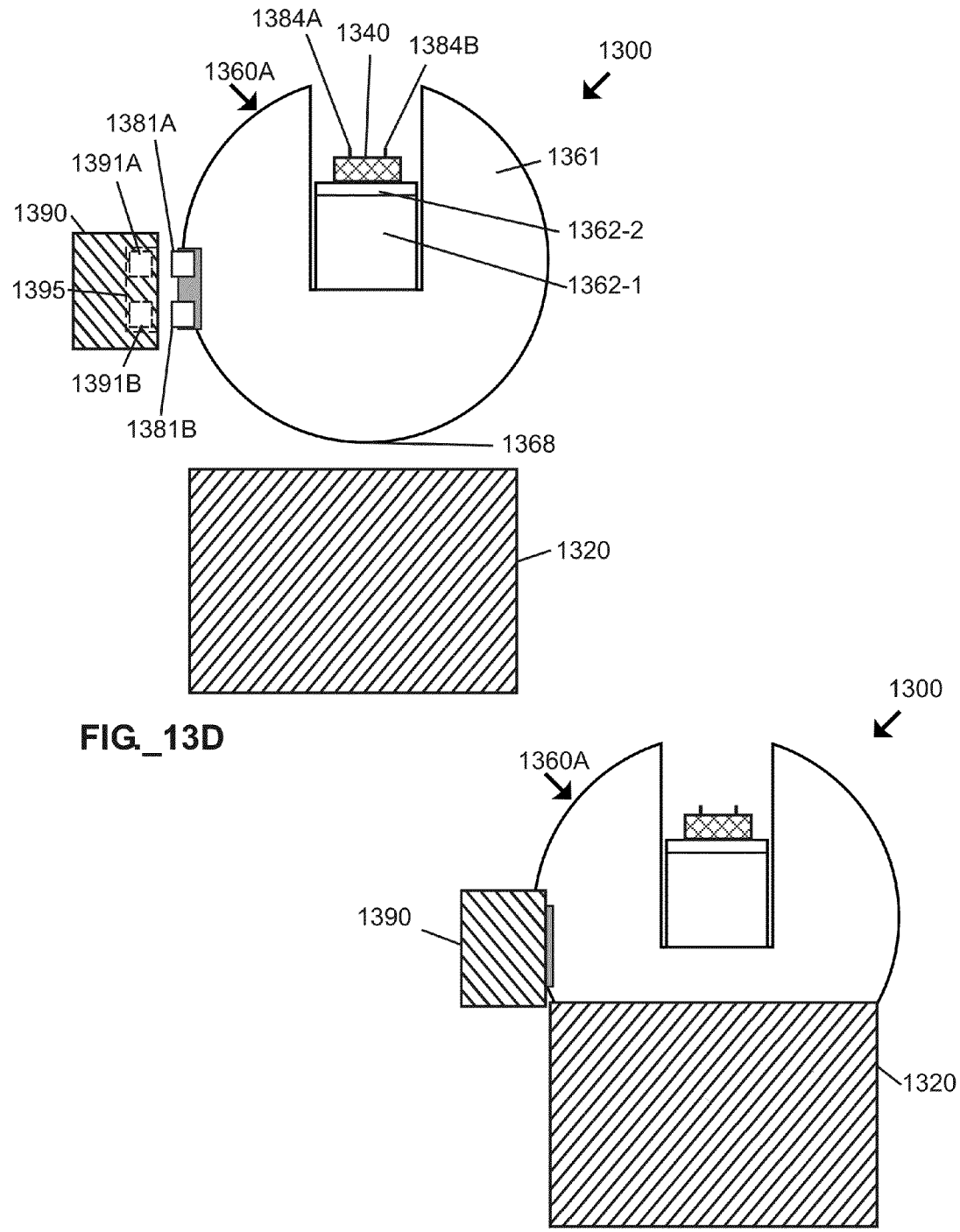
FIG._13D
FIG._13E

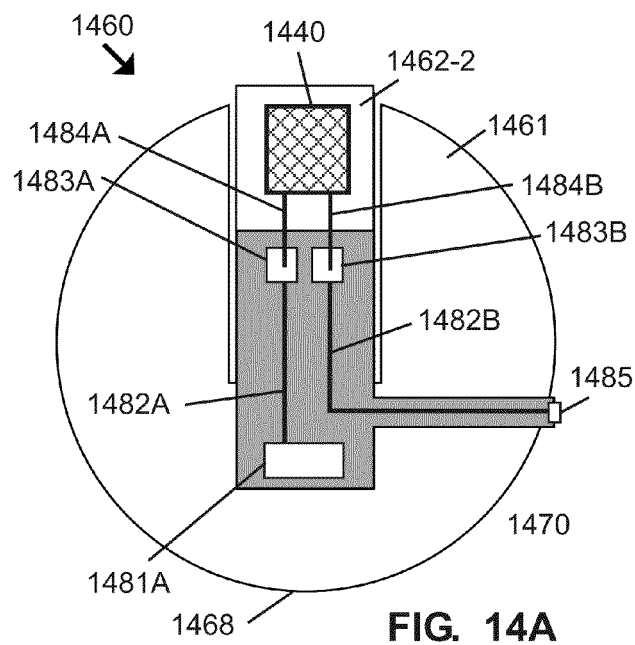
FIG._14A
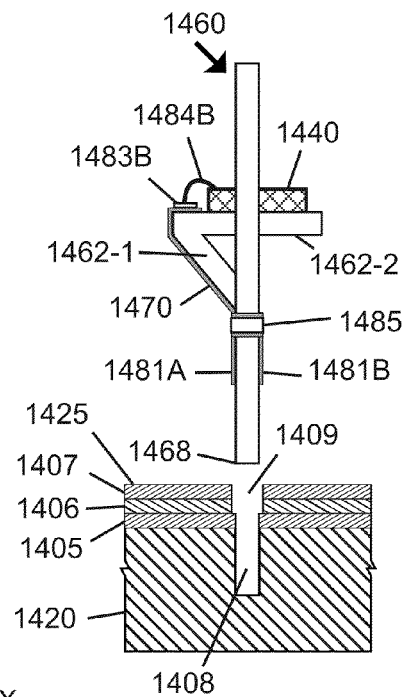
FIG._14B
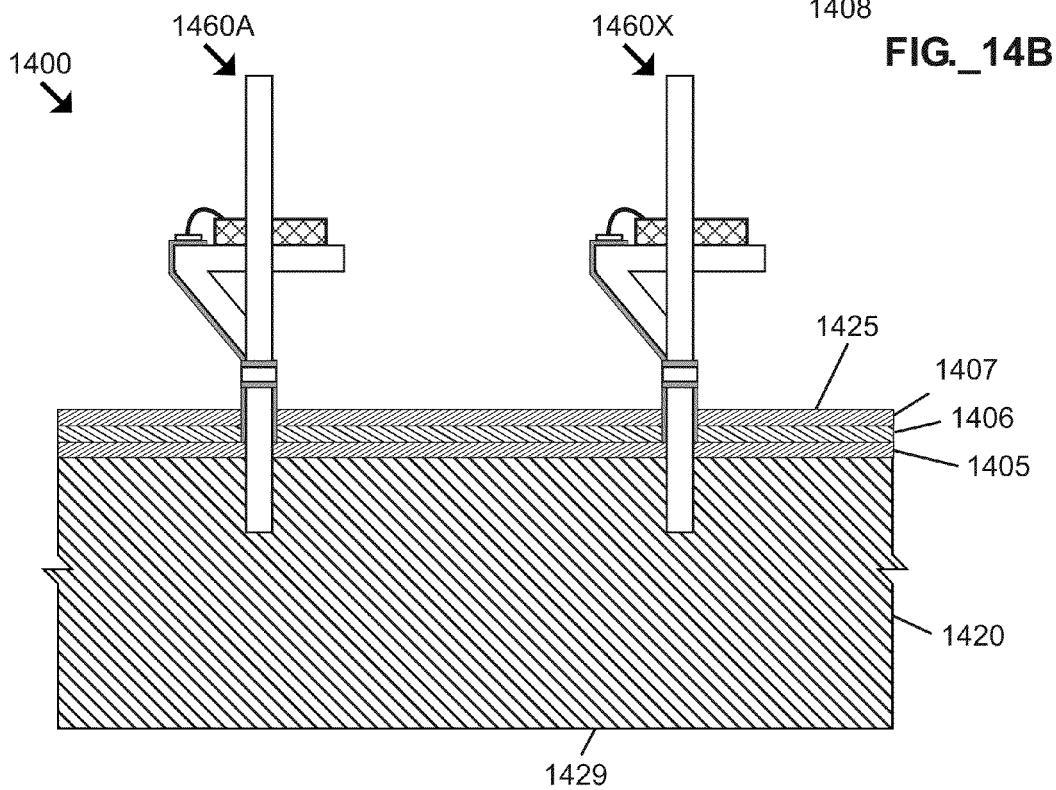
FIG._14C

SOLID STATE LIGHTING DEVICE WITH ELONGATED HEATSINK

FIELD OF THE INVENTION

The present invention relates to solid state lighting devices, including devices and light fixtures utilizing one or more light emitting diodes, and heat transfer structures relating to same.

BACKGROUND

Light emitting diodes (LEDs) are solid state devices that convert electric energy to light, and generally include one or more active layers of semiconductor material sandwiched between oppositely doped layers. When bias is applied across doped layers, holes and electrons are injected into one or more active layers where they recombine to generate light that is emitted from the device. Laser diodes are solid state emitters that operate according to similar principles.

Solid state light sources may be utilized to provide white light (e.g., perceived as being white or near-white), and have been investigated as potential replacements for conventional white incandescent and/or fluorescent lamps. Light perceived as white or near-white may be generated by a combination of red, green, and blue ("RGB") emitters, or, alternatively, by combined emissions of a blue light emitting diode ("LED") and a yellow phosphor. In the latter case, a portion of the blue LED emissions pass through the phosphor, while another portion of the blue LED emissions is 'downconverted' to yellow; the combination of blue and yellow light provide a white light. Another approach for producing white light is to stimulate phosphors or dyes of multiple colors with a violet or ultraviolet LED source.

Many modern lighting applications require high power solid state emitters to provide a desired level of brightness. High power solid state emitters can draw large currents, thereby generating significant amounts of heat that must be dissipated. Many solid state lighting systems utilize heatsinks in thermal communication with heat-generating solid state light sources. For heatsinks of substantial size and/or subject to exposure to a surrounding environment, aluminum is commonly employed as a heatsink material, owing to its reasonable cost, corrosion resistance, and relative ease of fabrication. Aluminum heatsinks for solid state lighting devices may be formed in various shapes by techniques such as casting, extrusion, and/or machining.

Elongated lighting devices such as fluorescent tube-based light fixtures are widely employed in commercial and industrial buildings, as well as in some residential environments. Solid state lighting devices are capable of operating at much greater luminous efficiency and greater reliability than fluorescent tubes, but solid state lighting devices generally include small-area emitters that approximate point sources—in contrast to the large emissive area characteristic of fluorescent tubes. It would be desirable to provide solid state lighting devices similar in size and conformation to fluorescent tube-based devices to enable retrofit of solid state light bulbs or solid state light fixtures in the same or a comparable envelope of space.

Certain elongated solid state lighting devices have been disclosed in the art. U.S. Patent Application Publication No. 2008/0037257 to Bolta ("Bolta") discloses a LED light fixture including at least one elongated heat transfer mounting bar, at least one emitter plate secured to the mounting bar, an array of LEDs secured to each emitter plate, and a diffusion lens arranged over the LED array. Mounting bars and/or heatsink portions thereof, which may be formed by extrusion, may be arranged in parallel to define air channels therebetween. Exterior and/or interior fans may be used to promote convective cooling. Another elongated device for focusing LED light on an illumination area is disclosed in U.S. Pat. No. 6,871,993, with the elongated device including multiple elongated fins arranged in parallel defining channels therebetween.

Elongated solid state lighting devices known in the art suffer from various limitations that restrict their utility. Elongated fins arranged parallel to one another tends to reduce the effectiveness of cross-flow air cooling (since channels between fins may be sheltered by adjacent fins), and can cause undesirable directional stratification of temperature over the length of an elongated lighting device when exposed to a parallel air flow (since the temperature of air flowing parallel to elongated inter-fin cooling channels increases as air travels from a leading edge of one channel to the trailing edge thereof). Directional stratification of temperature over the length of an elongated lighting device may be exacerbated when parallel fins extend in a downward or generally sideward direction, since natural convection may tend to trap heat in elongated inter-fin cooling channels.

It also may be cumbersome to mount and route electrical connections (e.g., conductors) to numerous solid state emitters arranged in one or more recesses and/or nonplanar surfaces of a conventional elongated solid state lighting device. Complex heatsink shapes may be expensive to form by extrusion or casting, and heatsinks formed by casting may be characterized by lower density than shapes formed by other techniques, with concomitant reduction of thermal conduction capability (which may require larger heatsinks to be used). Manufacturing difficulty and component expense are non-trivial, since the high cost of solid state lighting devices has impaired their widespread adoption.

It may also be difficult to place heat transfer structures in or on lighting devices while providing wide-angle light output without undue shadowing, particularly in view of the point source character of conventional solid state light emitters.

It would be desirable to provide elongated solid state lighting devices capable of reducing some or all of the limitations inherent to conventional elongated lighting devices.

SUMMARY

The present invention relates to solid state lighting devices including elongated heatsinks with multiple raised features each including a major surface non-parallel to a longitudinal (or lengthwise) direction of the heatsink.

In one aspect, the invention relates to a lighting device that includes a plurality of solid state light emitters in conductive thermal communication with a device-scale heatsink having a length extending in a longitudinal direction and having a width extending in a lateral direction, wherein: the length is at least about five times the width; the device-scale heatsink includes a plurality of raised features; and each raised feature of the plurality of raised features includes a major surface arranged non-parallel to the longitudinal direction.

In another aspect, the invention relates to a lighting device that includes a plurality of solid state light emitters in conductive thermal communication with a device-scale heatsink having a length extending in a longitudinal direction and having a width extending in a lateral direction, wherein: the length is at least about five times the width; the device-scale heatsink includes a plurality of raised features; and each raised feature of the plurality of raised features has a maximum dimension that is no greater than about two times the width of the device-scale heatsink.

In another aspect, the invention relates to a lighting device that includes a plurality of solid state light emitters in conductive thermal communication with at least one emitter support surface defined in or on a portion of a threaded rod or tube.

In another aspect, the invention relates to a method for fabricating a lighting device that includes mounting a plurality of solid state light emitters in conductive thermal communication with at least one emitter support surface defined in or on a portion of a threaded rod or tube.

In another aspect, the invention relates to a method for fabricating a lighting device that includes mounting a plurality of solid state light emitters in conductive thermal communication with a plurality of emitter support elements, and joining the plurality of emitter support elements in conductive thermal communication with a device-scale heatsink having a length extending in a longitudinal direction and having a width extending in a lateral direction, wherein the length is at least about five times the width, and wherein each emitter support element includes a major surface arranged non-parallel to the longitudinal direction.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1A is a side elevation schematic view of at least a portion of a lighting device including multiple solid state light emitters in conductive thermal communication with an elongated heatsink with a length (extending in a longitudinal direction) at least about five times (more preferably at least about ten times) its width (extending in a lateral direction), and with multiple raised features arranged substantially perpendicular to the longitudinal direction, according to one aspect of the present invention.

FIG. 1B is a side elevation schematic view of a lighting device according to FIG. 1A, including a diffuser arranged over the multiple solid state light emitters.

FIG. 2 is a bottom plan schematic view of at least a portion of a light fixture including multiple lighting devices each including multiple solid state light emitters in conductive thermal communication with an elongated heatsink with a length (extending in a longitudinal direction) at least about five times (more preferably at least about ten times) its width (extending in a lateral direction), and with multiple raised features arranged substantially perpendicular to the longitudinal direction, according to another aspect of the present invention.

FIG. 3A is a top plan view of a threaded rod useable to produce one or more elongated heatsinks according to one aspect of the present invention.

FIG. 3B is a top plan view of an elongated heatsink fabricated by cutting lengthwise the threaded rod of FIG. 3A.

FIG. 4A is a perspective schematic view of at least a portion of a lighting device including an elongated heatsink fabricated by cutting a rod (e.g., a threaded rod of FIG. 3A) in half lengthwise to define an emitter support surface, with multiple solid state light emitters mounted in conductive thermal communication with the emitter support surface of the elongated heatsink.

FIG. 4B is a perspective schematic view of at least a portion of another lighting device including an elongated heatsink fabricated by cutting a rod into multiple sections, with the elongated heatsink having a lateral cross-section including an arc representing approximately one third of the cross-sectional area of the starting rod to define two non-coplanar emitter support surfaces angled away from one another, and with solid state light emitters mounted in conductive thermal communication with first and second emitter support surfaces of the elongated heatsink.

FIG. 4C is a perspective schematic view of at least a portion of another lighting device including an elongated heatsink fabricated by cutting a rod into multiple sections, with the elongated heatsink having a lateral cross-section including an arc representing approximately one fourth of the cross-sectional area of the starting rod to define two non-coplanar emitter support surfaces angled away from one another, and with solid state light emitters mounted in conductive thermal communication with first and second emitter support surfaces of the elongated heatsink.

FIG. 4D is a perspective schematic view of at least a portion of another lighting device including an elongated heatsink fabricated by cutting a rod into multiple sections, with the elongated heatsink having a lateral cross-section section including an arc representing more than half of the cross-sectional area of the starting rod to define two non-coplanar emitter support surfaces angled toward one another, and with solid state light emitters mounted in conductive thermal communication with first and second emitter support surfaces of the elongated heatsink.

FIG. 4E is a perspective schematic view of at least a portion of another lighting device including an elongated heatsink fabricated by cutting a rod into multiple sections, with the elongated heatsink having a lateral cross-section section including an arc representing less than half of the cross-sectional area of the starting rod to define three non-coplanar emitter support surfaces angled away from one another, and with solid state light emitters mounted in conductive thermal communication with first, second, and third emitter support surfaces of the elongated heatsink.

FIG. 5A is a perspective schematic view of at least a portion of a lighting device including an elongated heatsink fabricated by cutting a rod in half lengthwise to define an emitter support surface, with multiple solid state light emitters mounted in conductive thermal communication with the emitter support surface of the elongated heatsink, and with slots for receiving a diffuser element defined in along a curved surface of the elongated heatsink.

FIG. 5B is an end elevation schematic view of a lighting device including the elongated heatsink and solid state light emitters of FIG. 5A, including a diffuser element arranged to receive emissions from the solid state light emitters, with the diffuser element being retained by slits defined in the elongated heatsink.

FIG. 6 is a side cross-sectional view of a portion of a lighting device including an elongated heatsink with solid state light emitters mounted thereon and with multiple raised features arranged non-parallel to a longitudinal direction of the heatsink, wherein the raised features are arranged not to receive direct emissions from solid state emitters mounted on or over an emitter support surface of the elongated heatsink.

FIG. 7 is a side cross-sectional view of a portion of a lighting device including an elongated heatsink with solid state light emitters mounted thereon and with multiple raised features arranged non-parallel to a longitudinal direction of the heatsink and extending outward from an emitter support surface, wherein the raised features are arranged to receive direct emissions from the solid state light emitters.

FIG. 8 is a side cross-sectional view of a portion of a lighting device including an elongated heatsink with multiple raised features each inserted into a different recess of the elongated heatsink and each including a major surface arranged non-parallel to a longitudinal direction of the heatsink, wherein each raised feature also serves as an emitter support element supporting at least one solid state light emitter.

FIG. 9 is a side cross-sectional view of a portion of a lighting device including an elongated heatsink with multiple raised features each inserted into two different recesses of the elongated heatsink and each including first and second major surfaces arranged non-parallel to a longitudinal direction of the heatsink, wherein each raised feature also serves as an emitter support element supporting at least one solid state light emitter.

FIG. 10 is a side cross-sectional view of a portion of a lighting device including an elongated heatsink with multiple raised features each inserted into two different recesses of the elongated heatsink and each including first and second major surfaces arranged non-parallel to a longitudinal direction of the heatsink, wherein each raised feature also serves as an emitter support element supporting multiple solid state light emitters.

FIG. 11 is a side cross-sectional view of a portion of a lighting device including an elongated heatsink with multiple raised features each inserted a different recesses of the elongated heatsink and each including a major surface arranged non-parallel to a longitudinal direction of the heatsink, wherein each raised feature serves as an emitter support element supporting multiple solid state light emitters.

FIG. 12A is a rear elevation view of a blank useful for forming a raised feature and solid state light emitter support element for an elongated heatsink of a lighting device according to one embodiment of the present invention.

FIG. 12B is a front elevation view of a raised feature and solid state light emitter support element fabricated from the blank of FIG. 12A, with a solid state light emitter supported thereon and following bending of a portion of the raised feature to support the emitter in a horizontal conformation.

FIG. 12C is a side cross-sectional view of a portion of a lighting device including an elongated heatsink with multiple raised features according to FIG. 12B, with portions of the raised features being inserted into different recesses defined in the elongated heatsink.

FIG. 13A is a front elevation view of a raised feature and solid state light emitter support element prior to bending of a portion thereof and arranged for insertion into a recess of an elongated heatsink, with the raised feature including insulating material and a solid state light emitter formed over portions thereof, and including electrical connections formed along an edge thereof.

FIG. 13B is a side elevation view of a raised feature and support element according to FIG. 13A, following bending of a portion of the raised feature to support the emitter in a horizontal conformation.

FIG. 13C is a side cross-sectional view of a portion of a lighting device including an elongated heatsink with multiple raised features according to FIG. 13B, with portions of the raised features being inserted into a different recesses defined in the elongated heatsink.

FIG. 13D is a front cross-sectional assembly view of a portion of the lighting device according to FIG. 13C (taken along section line "A"-"A" shown in FIG. 13C), including a slotted electrical connection rail (with internal structures illustrated in broken lines) adapted to mate with edge contacts of the raised features of FIG. 13C.

FIG. 13E is a front cross-sectional view of an assembled portion of the lighting device according to FIGS. 13C-13D (taken along section line "A"-"A" shown in FIG. 13C), depicting a raised feature inserted into a recess of the elongated heatsink and depicting the slotted electrical connection rail arranged in mating relationship with edge contacts of the raised feature and emitter support element.

FIG. 14A is a front elevation view of a raised feature and solid state light emitter support element prior to bending of a portion thereof, with the raised feature insulating material and a solid state light emitter formed over portions thereof, and including electrically conductive portions formed along front and rear faces thereof to receive current from a conductive element arranged on or in an elongated heatsink.

FIG. 14B is a side cross-sectional assembly view of a portion of a lighting device including a raised feature and solid state light emitter support element according to FIG. 14A following bending of a portion of the raised feature to support the emitter in a horizontal conformation, arranged for insertion into a compound recess of an elongated heatsink, with a first recess portion arranged to make thermal connection to the raised feature and a second recess portion arranged to make electrical connections between the electrically conductive portions of the raised feature and a conductive element arranged in or on the elongated heatsink.

FIG. 14C is a side cross-sectional view of an assembled portion of a lighting device including the elements depicted in FIG. 14B, including multiple raised feature and solid state light emitter support elements received in corresponding compound recesses formed in the elongated heatsink.

DETAILED DESCRIPTION

The present invention relates to solid state lighting devices including elongated heatsinks with multiple raised features each including a major surface non-parallel to a longitudinal (or lengthwise) direction of the heatsink. Such raised features may constitute fins to aid in dissipating heat.

As compared to use of elongated fins parallel to one another extending in a longitudinal direction, presence of raised features or fins arranged in a direction non-parallel (preferably substantially perpendicular) to a longitudinal direction of an elongated heatsink tends to reduce average dimensions of air channels between such raised features or fins, thereby reducing directional stratification of temperature of the length of an elongated device.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude the presence of one or more elements.

It will be understood that when an element such as a layer, region or substrate is referred to as being "on" or extending "onto" another element, it can be directly on or extend directly onto the other element, or intervening elements may also be present unless specifically indicated to the contrary.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

In certain embodiments, lighting devices and fixtures as described herein are contemplated for use in replacing conventional fluorescent tube-based light bulbs and light fixtures.

The terms "solid state light emitter" or "solid state emitter" as used herein refers to solid state devices capable of producing visible or near visible (e.g., from infrared to ultraviolet) wavelength radiation, including but not limited light emitting diodes (LEDs), organic light emitting diodes (OLEDs), and lasers. Various types of solid state light emitters generate steady state thermal loads upon application thereto of an operating current and voltage. Such steady state thermal load and operating current and voltage are understood to correspond to operation of the solid state light emitter at a level that maximizes emissive output at an appropriately long operating life (preferably at least about 5000 hours, more preferably at least about 10,000 hours, more preferably still at least about 20,000 hours).

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors adapted to generate white light emissions or emissions that may be perceived as white). Inclusion of lumiphoric (also called 'luminescent') materials in lighting devices as described herein may be accomplished by adding such materials to encapsulants, adding such materials to lenses, by embedding or dispersing such materials to lumiphor support elements, or other methods. Other materials, such as dispersers and/or index matching materials, may be included in or on a lumiphor support medium.

In certain embodiments, a solid state lighting device or light fixture as disclosed herein may have a luminous efficiency of at least about 100 lumens per watt, and/or a color rendering index of at least about 90. Solid state emitters of various colors including any suitable combinations of two or more of (i) blue solid state emitters, (ii) red, amber, and/or orange solid state emitters, (iii) green solid state emitters, (iv) cyan solid state emitters, (v) yellow solid state emitters, (vi) yellow lumiphors, (vii) red, amber, and/or orange lumiphors, (viii) green lumiphors, and (ix) cyan lumiphors, may be used in a single lighting device or light fixture, or in multiple emitter packages used in such a lighting device or light fixture. Lumiphors may be spatially segregated from electrically activated solid state emitters (e.g., LEDs) in order to reduce conductive thermal heating thereof. Solid state emitters of different colors may be separately controlled (whether in a single lighting device or among different lighting devices optionally installed into a single light fixture) to enable control of color temperature and/or color rendering index of a lighting device or light fixture.

The term "device-scale heat sink" as used herein refers to a heat sink suitable for dissipating substantially all of the steady state thermal load from at least one chip-scale solid state emitter to an ambient environment, with a device-scale heat sink preferably having a minimum major dimension (e.g., height, width, diameter) of preferably about 2.5 cm or greater, more preferably about 5 cm or greater, still more preferably about 10 cm or greater. A device-scale heat sink differs from a "chip-scale heat sink" which, as used herein or otherwise in the art, refers to a heat sink that is smaller than and/or has less thermal dissipation capability than a device-scale heat sink.

Lighting devices as described herein include device-scale heat sinks for multiple solid state light emitters, with such heat sinks preferably being exposed to an ambient environment external to the lighting device and adapted to dissipate substantially all of the steady state thermal load of one or more solid state emitters to the ambient environment (e.g., an ambient air environment). Such heat sinks may be sized and shaped to dissipate significant steady state thermal loads (preferably at least about 1 watt, more preferably at least about 2 watts, more preferably at least about 4 watts, more preferably at least about 10 watts, and more preferably at least about 20 watts) to an ambient air environment, without causing excess solid state emitter junction temperatures that would detrimentally shorten service life of such emitter(s). For example, operation of a solid state light emitter at a junction temperature of 85° C. may provide an average solid state emitter life of 50,000 hours, while temperatures of 95° C., 105° C., 115° C., and 125° C. may result in average service life durations of 25,000 hours, 12,000 hours, 6,000 hours, and 3,000 hours, respectively. In one embodiment, a device-scale heat sink of a lighting device as described herein is adapted to dissipate a steady state thermal load at least about 2 Watts (more preferably at least about 4 Watts, more preferably at least about 10 watts, still more preferably at least about 20 watts) in an ambient air environment of about 35° C. while maintaining a junction temperature of the solid state emitter at or below about 95° C. (more preferably at or below about 85° C.). The term "junction temperature" in this context refers to an electrical junction disposed on a solid state light emitter chip, such as a wirebond or other contact. Size, shape, and exposed area of a device-scale heat sink as disclosed herein may be adjusted to provide desired thermal performance.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts or traces enabling electrical connection to an external circuit. Encapsulant material, optionally including luminescent material, may be disposed over solid state emitters. Multiple solid state emitters may be provided in a single package. Individual emitters or groups of emitters in a solid state emitter package (e.g., each group optionally including multiple emitters connected in series) may be separately controlled. Multiple solid state emitter packages may be arranged in a single solid state lighting device. At least some solid state emitters may be connected in parallel to a control circuit, optionally including distinct current control elements to permit such emitters to be independently controllable. In certain embodiments, individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties), and a control system may be configured to selectively provide one or more control signals to the at least one current supply circuit. In various embodiments, current to different circuits or circuit portions may be pre-set, user-defined, and/or responsive to one or more inputs or other control parameters. In certain embodiments, operation of a solid lighting device or light fixture may be controlled responsive to an output signal of at least one sensor.

The term "edge contact" as used herein refers to an electrically conductive contact disposed along an edge of a substrate such as an emitter support element, preferably over an electrically insulating portion thereof. An edge contact may be formed as a portion of a printed circuit board (PCB). In certain embodiments, an edge contact may include electrically conductive material (e.g., copper, gold, or another suitably conductive metal, or a conductive polymer) metalized or otherwise disposed at least on an edge of a substrate, preferably extending to at least one face of the substrate, and more preferably extending to both opposing faces of the substrate.

In one embodiment, a device-scale heatsink of a solid state lighting device has a length extending in a longitudinal direction and a width extending in a lateral direction, with multiple raised features each including a major surface arranged non-parallel to the longitudinal direction, wherein the length is preferably at least about five times the width, more preferably at least about ten times the width, more preferably at least about fifteen times the width, more preferably at least about twenty times the width, more preferably at least about thirty times the width, and more preferably at least about fifty times the width. Each raised feature may include a major surface arranged substantially perpendicular to the longitudinal direction. Relative to a nominal width of the device-scale heatsink, each raised feature may protrude from a surface of a device-scale heatsink by a distance of preferably at least about ten percent of the nominal width, or more preferably at least about fifteen percent, twenty percent, thirty percent, forty percent, fifty percent, seventy-five percent, or one hundred percent of the nominal width in different embodiments. Such raised features may be provided in any suitable number and spacing, with the number of raised features in certain embodiments preferably being at least about ten, more preferably at least about twenty, more preferably at least about fifty, more preferably at least about one hundred, or more preferably at least about two hundred or more, depending on the dimensions of the elongated heatsink. If the width of the heatsink varies, then in certain embodiments the ratio of length to width may be relative to a minimum width of the heatsink; in other embodiments the ratio of length to width may be relative to an average width of the heatsink; and in still other embodiments the ratio of length to width may be relative to a maximum width of the heatsink.

Multiple solid state light emitters are arranged in conductive thermal communication with an elongated device-scale heatsink. In certain embodiments, such solid-state light emitters are arranged in solid state emitter packages as described previously herein. Conductive thermal communication between solid-state lighting emitters or associated packages may be aided by use of thermally conductive paste disposed therebetween. In certain embodiments, a device-scale heatsink is electrically isolated from associated solid state light emitters (e.g., arranged thereon, therein, or thereover); such electrical isolation may be provided by one or more electrically insulating layers formed on the solid state emitters and/or the device-scale heatsink (or emitter support element thereof).

In certain embodiments, one or more solid state light emitters may be recessed or embedded in a surface of an elongated device-scale heatsink as described herein. Additionally, or alternatively, one or more portions of a device-scale heatsink may serve as reflector(s) arranged to reflect emissions of one or more solid state emitters in one or more desired direction(s).

Raised features associated with an elongated heatsink may or may not be arranged to receive direct emissions, or be illuminated by, from solid-state light emitters in conductive thermal communication with the heatsink. In certain embodiment, at least one emitter support surface is devoid of raised features, with raised features arranged to extend in one or more directions away from solid state light emitters to prevent direct illumination of the raised features.

In certain embodiments, raised features associated with an elongated heatsink as described herein may be colored, textured, shaped, and/or faceted to facilitate desired interaction with emissions generated by solid state emitters. Such interaction may specifically include reduction of shadowing generated by an elongated light emitting device.

In certain embodiments, a device-scale heatsink including multiple raised features as described herein includes multiple non-coplanar emitter support surfaces. Such emitter support surfaces may or may not be associated with raised features of the heatsink. Each emitter support surface may be in conductive thermal communication with multiple solid state light emitters.

In certain embodiments, a device-scale heatsink comprises at least a portion of an externally threaded rod or tube, with threads thereof constituting raised features as described herein. Threads may be formed along an external surface of a rod or tube by conventional means (e.g., lathe turning, rotary extrusion, casting, etc.). The rod or tube may then be cut lengthwise (e.g., into halves, third, quarters, or other shapes have acute, obtuse, or reflex angle cross-sections), or otherwise processed (e.g., via grinding) to define one or more emitter support surfaces for receiving a plurality of solid state light emitters. A lighting device may include multiple solid state light emitters in conductive thermal communication with at least one emitter support surface (optionally multiple emitter support surfaces) defined in or on a portion of a threaded rod or tube, with such support surface(s) optionally formed by lengthwise cutting or grinding of a threaded rod or tube. An emitter support surface may be flat, curved, peaked, ridged, or may assume any desirable shape. In one embodiment, a portion of a threaded rod or tube includes multiple emitter support surfaces arranged non-coplanar with one another, with each emitter support surface supporting multiple solid state light emitters.

Although various embodiments depicted in the drawings illustrate rods having curved lower surfaces thereof, the invention is not limited to heatsinks having cross-sections representing portions of circles or arcs. Instead, rods or tubes of any desired cross-sectional shapes may be used, including rods or tubes representing at least portions of squares, rectangles, pentagons, hexagons, octagons, stars, rhombi, regular polygons, irregular polygons, ovals, curvilinear shapes, and/or mixed curvilinear and linear shapes may be employed.

Ends of an elongated heatsink as described herein may be terminated with end caps, preferably including electrical connectors, to form an elongated lighting device. Any suitable number and type of electrical connectors may be provided. In one embodiment, a solid state lighting device comprises a light bulb being sized and configured for replacement of a fluorescent tube in a conventional fluorescent tube-type light fixture, optionally accompanied by appropriate electrical circuit elements for either interfacing with a conventional fluorescent-type lamp ballast or for replacing such ballast with circuits specifically adapted for driving solid state lighting devices.

One or more features (e.g., slots, protrusions, recesses, ridges, anchors, etc.) may be provided in or along a surface of an elongated heatsink to receive a diffuser or other optical element arranged to receive and interact with (e.g., diffuse) light emissions generated by solid state light emitters in conductive thermal communication with an elongated heatsink as described herein. In one embodiment, a diffuser is arranged to receive emissions of multiple solid state light emitters of different dominant wavelengths (colors) to facilitate mixing of such emissions. In one embodiment, a diffuser or other optical element arranged to receive emissions from a solid state light emitters further includes one or more lumiphoric materials (e.g., phosphors) to generate light of desired perceived colors (including combinations of colors that may be perceived as white in combination with spectral emissions from the solid state light emitters).

Electrical communication with solid state light emitters of a lighting device as described herein may be made with or without an elongated heatsink or a portion thereof. At least one electrical conductor may extend to or between each emitter support element of the plurality of emitter support elements. In certain embodiments, at least one electrical conductor is arranged within an interior of an elongated heatsink, without being in conductive electrical communication therewith. In certain embodiments, at least one electrical conductor is arranged in or along a surface (e.g., external) of an elongated heatsink. In certain embodiments, at least one electrical conductor is physically separated from an elongated heatsink, such as in or on an electrical conduction rail structure, which may include one or multiple conductors. In certain embodiments, multiple solid state light emitters are electrically connected in series. In certain embodiments, multiple solid state light emitters are electrically connected in parallel. In certain embodiments, multiple groups of solid state light emitters are provided in conductive thermal communication with one elongated heatsink, and each group is separately controllable. In certain embodiments, each solid state light emitter in conductive thermal communication with an elongated heatsink is independently controllable. One or more sensors and/or control elements (e.g., ballasts, dimmers, current/voltage regulators, electrostatic discharge elements, sensors, thermal feedback circuits, etc.) may be arranged within a lighting device or light fixture including an elongated heatsink as described herein, with operation of the lighting device or light fixture being controllable through (e.g., automatic) operation of the sensor(s) and/or control element(s). In one embodiment, a lighting device or light fixture as described herein includes at least one communication element is arranged to be controlled, interrogated, or otherwise accessed via a communication network, a computer, and/or other external controller.

In certain embodiments, an elongated heatsink includes multiple emitter support elements defining multiple raised features and arranged to support a plurality of solid state light emitters, with the plurality of emitter support elements being arranged in conductive thermal communication with the device-scale heatsink. The device-scale heatsink may include multiple recesses (e.g., slots), with at least a portion of each emitter support element being inserted into a different recess of the multiple recesses. Such recesses may be formed by conventional means including machining. In certain embodiments, compound recesses may be formed, including a first recess portion having a first thickness dimension, and a second recess portion having a second thickness dimension that differs from the first thickness dimension, with a first recess portion being arranged to provide thermal communication between the emitter support element and a body portion of the elongated heatsink, and with a second recess portion being arranged to provide electrical communication between electrical contacts of the emitter support element and at least one electrical conductor associated with the emitter support element. Conductive thermal contact between emitter support elements and an elongated heatsink may be alternatively or additionally facilitated by techniques such as brazing, soldering, or welding.

In certain embodiments, a lighting device may be fabricated by mounting a plurality of solid state light emitters in conductive thermal communication with a plurality of emitter support elements, and joining the plurality of emitter support elements in conductive thermal communication with a device-scale heatsink having a length extending in a longitudinal direction and having a width extending in a lateral direction, wherein the length is at least about five times the width (more preferably at least about ten times the width), and wherein each emitter support element includes a major surface arranged non-parallel to (e.g., optionally perpendicular to) the longitudinal direction. In one embodiment, the joining of the plurality of emitter support elements in conductive thermal communication with a device-scale heatsink includes inserting portions of the emitter support elements in a plurality of recessed formed in a body of an elongated heatsink. Emitter support elements may be fabricated by steps including stamping emitter support element blanks, and bending or shaping at least a portion of each emitter support element blanks into a non-planar configuration. Such bending or shaping may optionally occur after patterning of one or more electrically insulating and electrically conductive materials over at least one surface portion of the blank and after one or more solid state light emitters is mounted in conductive thermal communication with the blank.

In certain embodiments, emitter support elements may be formed by steps including stamping blanks from at least one layer of thermally conductive material (e.g., metal sheets, or metal core printed circuit boards), optionally forming at least one electrically insulating material over portions (e.g., at least one surface portion, optionally portions of multiple surfaces) of the blanks, and optionally forming electrically conductive traces over portions of the electrically insulating material. One or more solid state light emitters (such as may be embodied in solid state emitter packages) may be mounted in conductive thermal communication with each blank. A portion of each blank may be bent or otherwise shaped into a nonplanar configuration. At least one bend may be arranged between (i) a major surface defined by the emitter support element (i.e., arranged non-parallel, preferably substantially perpendicular, to a body of an elongated heatsink) and (ii) an emitter mounting region on the emitter support element. Conductive thermal communication may be established between each emitter support element and a body of an elongated heatsink element (such as, but not limited to, by inserting a portion of each emitter support element into a recess formed in the body of the elongated heatsink element). Air gaps are preferably provided between adjacent raised features (e.g., emitter support elements) to permit ventilation between the raised features. In certain embodiments, each emitter support element may have a maximum dimension that is no greater than about two times the width of the device-scale heatsink. In various embodiments, one or more solid state light emitters may be in electrical communication with at least a portion of an elongated heatsink, or may be electrically isolated from the heatsink.

Although stamping has been mentioned as one technique for forming emitter support elements blanks, in certain embodiments, emitter support elements or blanks therefor may be fabricated by one or more other techniques such as machining, casting, laser cutting, extruding, and slicing.

In one embodiment, a solid state lighting device including an elongated heatsink as described herein includes multiple solid state light emitters in conductive thermal communication therewith, wherein the device-scale heatsink includes a plurality of raised features, and each raised feature of the plurality of raised features has a maximum dimension that is no greater than about two times the width of the device-scale heatsink. Preferably, each raised feature includes a major surface arranged non-parallel to the longitudinal direction. Each raised feature is preferably spaced apart in a longitudinal direction from an adjacent raised feature to provide an air gap permitting ventilation between each raised feature and the adjacent raised feature. Ventilation may be provided by natural convection and/or forced convection (e.g., motivated by one or more fans or other fluid moving elements).

Various features described separately herein are contemplated to be combined in further embodiments, unless specifically indicated to the contrary herein.

The present invention now will be described more fully hereinafter with reference to the accompanying drawings, in which illustrative embodiments of the invention are shown. Aspects of the present invention may, however, be embodied in many different forms and should not be construed as limited to the specific embodiments set forth herein. Rather, the illustrated embodiments are provided to convey the scope of the invention to those skilled in the art. In the drawings, the size and relative sizes of layers and regions may be exaggerated for clarity.

FIG. 1A illustrates at least a portion of a lighting device 10 including multiple solid state light emitters 40A-40X in conductive thermal communication with an elongated heatsink body 20 defining an emitter support surface 25, having a length (extending in a longitudinal direction between ends 21, 22) at least about five times (more preferably at least about ten times) its width (extending in a lateral direction perpendicular to a line formable between the ends 21, 22), and including multiple raised features 60A-60X arranged substantially perpendicular to the longitudinal direction. (Although FIG. 1A show the device 10 having eight solid state light emitters 40A-40X and sixteen raised features 60A-60X, it will be readily apparent to one skilled in the art that any suitable number of emitters, raised features, or other elements may be provided. For this reason, the designation "X" is used to represent the last element in a series, with the understanding that "X" represents a variable that could represent any desired number of elements. This convention may be used elsewhere in this document.) The raised features 60A-60X may extend from one or multiple sides of the elongated heatsink body 20. The raised features 60A-60X may be formed by any suitable means, such as casting, or by cutting threads into an external surface of the heatsink body 20, and then forming the emitter support surface 20 by cutting or grinding. Air gaps are provided between adjacent features of the raised features 60A-60X. One or more electrical conductors (not shown), preferably segregated from the emitter support surface 25 by at least one electrically insulating material, may be formed on, over, or under the emitter support surface 25 or any other suitable portion of the lighting device 10 and used to conduct electric current to the solid state light emitters 40A-40X. At least one electrical circuit (e.g., control) element 50 may optionally be integrated with the lighting device 10, and end caps 31, 32 with associated electrical contacts 33, 34, respectively, may be provided at ends of the device 10 for interfacing with a light fixture.

FIG. 1B illustrates a lighting device 10-1 embodying identical elements as the device 10 illustrated FIG. 1A, with the addition of a diffuser element 49 arranged over the solid state light emitters 40A-40X and separated therefrom by an air gap 45. The diffuser element 49 is arranged to receive and diffuse emissions from the solid state light emitters 40A-40X.

FIG. 2 illustrates at least a portion of a light fixture 100 including multiple lighting devices 110, 110' each including multiple solid state light emitters 140A-140X, 140A'-140X', respectively, in conductive thermal communication with an elongated heatsink body 120, 120' having a length (extending in a longitudinal direction parallel to a line formed between ends 121-122, 121'-122' of the heatsinks 120, 120') at least about five times (more preferably at least about ten times) its width (extending in a lateral direction). Each heatsink 120, 120' includes multiple raised features 160A-160X, 160A'-160X' arranged substantially perpendicular to the longitudinal direction. The solid state light emitters 140A-140X, 140A'-140X' are supported by emitter support surfaces 125, 125' of the heatsinks 120, 120'. Each lighting device 110, 110' includes end caps 131-132, 131'-132' with associated electrical contacts 133-134, 133'-134' arranged for mating with respective sockets 135-136, 135'-136' associated with a body 101 of the light fixture 100. The fixture 100 includes at least one electrical circuit element 150 (e.g., optionally providing ballast, dimming, current/voltage regulation, electrostatic discharge, thermal feedback, color control, and/or sensor feedback utility) in electrical communication with an electric current source (not shown) and arranged to control the lighting devices 110, 100'. Various sensors 151-152, 151'-152' (e.g., thermal and/or optical sensors) may be arranged in sensory communication with the lighting devices 110, 100' and arranged to supply output signals to the at least one control element 150 to facilitate control of the lighting devices 110, 100'. In one embodiment, the fixture 100 may be sized and shaped to conform to a standard fluorescent tube-based light fixture to permit retrofit thereof.

As noted previously, an elongated heatsink of a solid state lighting device may be fabricated from a portion of a threaded rod or tube. FIG. 3A illustrates a threaded rod 301 including threads 302 arranged non-parallel to a longitudinal dimension of the rod 301, with the threads 302 capable of serving as raised features of an elongated heatsink for a lighting device as described herein. FIG. 3B is a top plan view of an elongated heatsink 320 fabricated by cutting lengthwise the threaded rod 301 of FIG. 3A, with the resulting portion of the threaded rod including an emitter support surface 325 and including raised features 360A-360X extending non-parallel to a longitudinal direction of the heatsink 320 (i.e., with the longitudinal direction extending parallel to a line formable between ends 321-320. A transverse direction of the heatsink 320 extends parallel to a line formable between sides 323-324). The raised features 360A-360X serve as fins to increase surface area of the heatsink 320 and enhance dissipation of heat therefrom during operation of solid state light emitters in conductive thermal communication with the heatsink 320.

As noted previously, a rod or tube (e.g., including external threads) may then be cut lengthwise (e.g., into halves, third, quarters, or other shapes have acute, obtuse, or reflex angle cross-sections), or otherwise processed (e.g., via grinding) to define one or more emitter support surfaces for receiving a plurality of solid state light emitters.

FIGS. 4A-4E illustrate portions of lighting devices including device-scale heatsinks of various conformations formed by sectioning a rod (e.g., a threaded rod) as described herein. FIG. 4A illustrates a device-scale heatsink 420A formed as a lengthwise half-section of a rod, with a single emitter support surface 425A extending a longitudinal direction between ends 421A-422A thereof and opposite a curved lower surface potion 429A. Multiple rows of solid state light emitters 440A-1-440X-1, 440A-1'-440X-1' are mounted in conductive thermal communication with the emitter support surface 425A. FIG. 4B illustrates another device-scale heatsink 420B formed by cutting a rod to form two emitter support surfaces 425B-426B with a cross-section having an obtuse angle portion of a circular arc. The emitter support surfaces 425B-426B extend in a longitudinal direction between ends 421B-422B of the heatsink 420B and opposite a curved lower surface potion 429B. Rows of solid state light emitters 440A-2-440X-2, 440A-2'-440X-2' are mounted in conductive thermal communication with the emitter support surfaces 425B, 426B, respectively. FIG. 4C illustrates another device-scale heatsink 420C formed as a lengthwise quarter-section of a rod to form two emitter support surfaces 425C-426C that extend in a longitudinal direction between ends 421C-422C of the heatsink 420C and opposite a curved lower surface potion 429c. Rows of solid state light emitters 440A-3-440X-3, 440A-3'-440X-3' are mounted in conductive thermal communication with the emitter support surfaces 425C, 426C, respectively. FIG. 4D illustrates another device-scale heatsink 420D formed by cutting a rod to form two emitter support surfaces 425D-426D with a cross-section having an reflex angle (greater than 180 degrees but less than 360 degrees) portion of a circular arc. The emitter support surfaces 425D-426D extend in a longitudinal direction between ends 421D-422D of the heatsink 420D and opposite a curved lower surface potion 429D. Rows of solid state light emitters 440A-4-440X-4, 440A-4'-440X-4' are mounted in conductive thermal communication with the emitter support surfaces 425D, 426D, respectively. FIG. 4E illustrates another device-scale heatsink 420E similar in shape to the heatsink 420B illustrated in FIG. 4B, but defining first, second, and third emitter support surfaces 425E-427E and three rows of solid state light emitters 440A-5-440X-5, 440A-5'-440X-5', 440A-5"-440X-5" in conductive communication therewith. The emitter support surfaces 425E-427E are non-coplanar with one another, extend in a lengthwise direction between ends 421E-422E of the heatsink 420E, and are opposite a curved lower surface portion 429E. Any of the foregoing heatsinks 420A-420E may include raised features along lower and/or upper surfaces thereof, even though not specifically depicted in FIGS. 4A-4B. It is to be further appreciated that the various heatsink shapes depicted in FIGS. 4A-4E are for purposes of illustration only, and that heatsinks of any suitable shape may be used.

FIG. 5A illustrates a portion of a lighting device including an elongated heatsink 520 similar in shape to the heatsink 420A depicted in FIG. 4A, with the addition of slots or recesses 537-538 arranged to receive and retain a diffuser element (such as the diffuser element 549 including tabs 547-548 illustrated in FIG. 5B). The heatsink 520 is formed as a lengthwise half-section of a rod, with a single emitter support surface 525 extending a longitudinal direction between ends 521-522 thereof and opposite a curved lower surface potion 529 into which the slots or recesses 537-538. Multiple rows of solid state light emitters 540A-1-540X-1, 540A-1'-540X-1' are mounted in conductive thermal communication with the emitter support surface 525. FIG. 5B illustrates another portion of a lighting device 520-1 including the heatsink 520 with addition of a diffuser 549 arranged over the solid state light emitters 540A-1-540X-1, 540A-1'-540X-1' with a space 545 therebetween. The diffuser 549 includes sections that curve around a portion of the heatsink 520 and include tabs 547-548 arranged for retention in the slots or recesses 537-538 defined in the heatsink 520.

Portions of lighting devices including elongated heatsinks are illustrated in FIGS. 6-11, 12C, 13C, and 14C. Although only portions of heatsinks are illustrated therein, it is to be appreciated that such heatsinks are intended to embody desired relative dimensions and other features as recited previously herein.

FIG. 6 illustrates a portion of a lighting device 610 including an elongated heatsink 620 with solid state light emitters 640A-640X mounted or over on an emitter support surface 625 thereof. The heatsink 620 includes multiple raised features 660A-660X arranged non-parallel to a longitudinal direction of the heatsink 620, wherein the raised features 660A-660X extend from a lower surface 629 opposing the emitter support surface 625, such that the raised features 660A-660X are arranged not to receive direct emissions from the solid state emitters 640A-640X. The raised features may be formed by any conventional means, including (but not limited to) insertion of fins into recesses formed in the heatsink 620, casting, sectioning a threaded rod, etc.

FIG. 7 illustrates a portion of a lighting device 710 including an elongated heatsink 720 with solid state light emitters 740A-740X mounted on or over an emitter support surface 725 that is opposite to a lower surface 729 thereof. The heatsink 720 includes multiple raised features 760A-760X arranged non-parallel to a longitudinal direction of the heatsink 720 and extending outward from the emitter support surface 725, such that raised features are arranged to receive direct emissions from the solid state light emitters 740A-740X. Each raised feature 760A-760X is arranged non-parallel to a longitudinal direction of the elongated heatsink 720, but the raised features 760A-760X are arranged non-perpendicular to the emitter support surface 725, with certain raised features 760A-760X being arranged non-parallel to one another. The raised features 760A-760X may include reflective surface portions and be arranged to reflect light emissions from the solid state light emitters 740A-740X in desired directions. Gaps between adjacent raised features 760A-760X permit flow of air or other cooling fluid therebetween. Although not shown in FIG. 7, additional raised features may extend from the elongated heatsink 720 along surfaces other than the emitter support surface 725.

FIG. 8 illustrates a portion of a lighting device 810 including an elongated heatsink 820 with multiple emitter support elements 860A-860X each inserted into a different recess defined in a proximal surface 825 of the elongated heatsink 820. Each emitter support element 860A-860X constitutes a raised feature in conductive thermal communication with the elongated heatsink 820, with a major surface portion 861A-861X extending non-parallel to a longitudinal direction of the heatsink 820. Each emitter support element 860A-860X also includes an emitter support surface portion 862A-862X that is elevated relative to a proximate surface 825 of the elongated heatsink 820, with a bend arranged between each emitter support surface portion 862A-862X and the associated major surface portion 861A-861X. Although not shown in FIG. 8, additional raised features may extend from the elongated heatsink 820 along surfaces other than the proximal surface 825, such as (but not limited to) extending from the distal surface 829 of the heatsink 820.

FIG. 9 illustrates a portion of a lighting device 910 including an elongated heatsink 920 with multiple emitter support elements 960A-960X each inserted into two different recesses defined in a proximal surface 925 of the elongated heatsink 920. Each emitter support element 960A-960X constitutes two raised features in conductive thermal communication with the elongated heatsink 920, including major surface portions 961A-961X, 963A-961X extending non-parallel to a longitudinal direction of the heatsink 920. Each emitter support element 960A-960X also includes an emitter support surface portion 962A-962X that is elevated relative to a proximate surface 925 of the elongated heatsink 920 and extends between bends formed at ends of the major surface portions 961A-961X, 963A-961X. An air gap 968A-968B is optionally formed between each emitter support surface portion 962A-962X and the proximate surface 925 of the elongated heatsink 920. Each emitter support surface portion 962A-962X may have a narrower width and/or perforated surface portion relative to the major surface portions 961A-961X, 963A-963X to reduce shielding of the proximate surface 925. In combination, each emitter support surface portion 962A-962X and major surface potion 961A-961X, 963A-963X may optionally define a reflector cup 969A-969X arranged to reflect light emissions from the associated solid state light emitters 940A-940X. Although not shown, additional raised features may extend from the elongated heatsink 920 along surfaces other than the proximal surface 925, such as (but not limited to) extending from the distal surface 929 of the heatsink 920.

FIG. 10 illustrates a portion of another lighting device 1010 substantially similar to the device 910 depicted in FIG. 9, but with multiple emitters 1040A-1040A', 1040X-1040X' supported by each emitter support element 1060A-1060X. Each emitter support element 1060A-1060X constitutes two raised features in conductive thermal communication with the elongated heatsink 1020, including major surface portions 1061A-1061X, 1063A-1061X extending non-parallel to a longitudinal direction of the heatsink 1020. Each emitter support element 1060A-1060X also includes an emitter support surface portion 1062A-1062X that is elevated relative to a proximate surface 1025 of the elongated heatsink 1020 and extends between bends formed at ends of the major surface portions 1061A-1061X, 1063A-1063X. An air gap 1068A-1068B is optionally formed between each emitter support surface portion 1062A-1062X and the proximate surface 1025 of the elongated heatsink 1020. In combination, each emitter support surface portion 1062A-1062X and major surface potion 1061A-1061X, 1063A-1063X may optionally define a reflector cup 1069A-1069X arranged to reflect light emissions from the associated solid state light emitters 1040A-1040A', 1040X-1040X'. Additional raised features (not shown) may extend from the elongated heatsink 1020 along surfaces other than the proximal surface 1025, such as (but not limited to) extending from the distal surface 1029 of the heatsink 1020.

FIG. 11 illustrates a portion of another lighting device 1110 including multiple emitters 1140A-1140A', 1140X-1140X' supported by each emitter support element 1160A-1160X. Each emitter support element 1160A-1160X includes a raised feature in conductive thermal communication with the elongated heatsink 1120, including a major surface portion 1161A, 1161X extending non-parallel to a longitudinal direction of the heatsink 1120. Each emitter support element 1160A-1160X also includes two emitter support surface portions 1162A-1163A, 1162X-1163X that are elevated relative to a proximate surface 1125 of the elongated heatsink 1120 and extend from a bend formed at a distal end of the major surface portion 1161A-1161X. Each emitter support surface portions 1162A-1163A, 1162X-1163X may also be arranged to reflect light emissions generated by the solid state light emitters 1140A-1140A', 11040X-1040X'. Additional raised features (not shown) may extend from the elongated heatsink 1120 along surfaces other than the proximal surface 1125, such as (but not limited to) extending from the distal surface 1129 of the heatsink 1120.

FIG. 12A illustrates a blank 1260' useful for forming a raised feature and solid state light emitter support element (combined) for an elongated heatsink of a lighting device according to one embodiment. As illustrated, the blank 1260' is generally round in shape, with a tab portion 1262 defined between two vertical slots 1259A-1259B and being arranged for bending to form an emitter support surface (i.e., surface portion 1262-2 illustrated in FIG. 12B) arranged non-coplanar with a major surface portion 1261 thereof. A lower end portion 1268 is arranged for insertion into a recess defined in an elongated heatsink (not shown) to promote conductive thermal communication therewith. Although various techniques may be used for fabricating the blank 1260', in one embodiment the blank 1260' is fabricated by stamping a metal-containing sheet, such as aluminum sheet metal or a metal core printed circuit board. FIG. 12B illustrates a raised feature and solid state light emitter support element 1260 fabricated from the blank 1260' of FIG. 12A, with a solid state light emitter 1240 supported on an emitter support surface portion 1262-2 following bending of a tab portion 1262-1 (e.g., with multiple bends) to support the solid state light emitter 1240 substantially perpendicular to the major surface portion 1261. FIG. 12C illustrates a portion of a lighting device 1200 including an elongated heatsink 1220 with multiple raised features and emitter support elements 1260A-1260X according to FIG. 12B, with a lower end portion 1268 of each raised feature 1260A-1260X being inserted into different recesses defined in the elongated heatsink 1220, thereby establishing conductive thermal communication between each raised feature 1260A-1260X and the elongated heatsink 1220. Thermal communication and/or mechanical retention may further be aided by brazed, soldered, or welded connections 1202A-1202X between each raised feature 1260A-1260X and the elongated heatsink 1220. A portion of each major surface potion 1260 extends above each solid state light emitter 1240A-1240X to reflect light emissions generated by the emitters 1240A-1240X in desired directions, such as to reduce shadowing by the lighting device 1200. Although not shown, a diffuser may be optionally integrated with the lighting device 1200 to diffuse emissions generated by the solid state light emitters 1240A-1240X.

Although FIG. 12B illustrates a raised feature and solid state light emitter support element as being substantially round in shape, it is to be appreciated that in various embodiments, raised feature and solid state light emitter support elements may be of any desirable shape, such as, but not limited to, at least portions of squares, rectangles, pentagons, hexagons, octagons, stars, rhombi, regular polygons, irregular polygons, ovals, curvilinear shapes, mixed curvilinear and linear shapes, and combinations thereof. Such elements may be substantially solid or at least portions thereof may be hollow and/or contain recesses. It is to be further appreciated that any of various fins or textures may be added to raised feature and solid state light emitter support elements to provide increased surface area for enhanced heat transfer, light directing, and/or light shaping utility.

FIGS. 13A-13E relate to a solid state lighting device including a raised feature and solid state light emitter support element including electrical connections formed along an edge thereof, for mating with an electrical conduction rail or similar element for conducting electric current to emitters of the lighting device.

FIG. 13A illustrates a raised feature and solid state light emitter support element 1360 prior to bending of a portion thereof, with the element 1360 being arranged for insertion into a recess of an elongated heatsink (as shown in FIG. 13C). A blank portion of the raised feature and solid state light emitter support element 1360 may be formed by stamping. A major surface portion 1361 may be fabricated of metal, with an electrically insulating material 1370 provided over at least one surface portion thereof. Conductive traces 1382A-1382B extend between edge contacts 1381A-1381B and bond pads 1383A-1383B. A solid state light emitter 1340 is arranged in conductive thermal communication with a tab portion as an emitter support element 1362-2. Wirebonds 1384A-1384B may extend between the bond pads 1383A-1383B and the solid state light emitter 1340 to provide electrical communication with the solid state emitter 1340. A lower portion 1368 of the raised feature and solid state light emitter support element 1360 is arranged for insertion into a recess of an elongated heatsink (such as heatsink 1320 shown in FIG. 13C). FIG. 13B is a side elevation view of a raised feature and support element 1360 according to FIG. 13A, following bending of a tab portion 1361-1 thereof to form first and second bends to provide an emitter support surface portion 1361-2 arranged to support the solid state emitter 1340 substantially perpendicular to the major surface portion 1361.

FIG. 13C illustrates a portion of a lighting device 1300 including an elongated heatsink 1320 with multiple raised features and emitter support elements 1360A-1360X according to FIG. 13B, with a lower end portion 1368 of each raised feature 1360A-1360X being inserted into different recesses defined in the elongated heatsink 1320, thereby establishing conductive thermal communication between each raised feature and emitter support element 1360A-1360X and the elongated heatsink 1320.

FIG. 13D is a front cross-sectional assembly view of a portion of the lighting device 1300 according to FIG. 13C (taken along section line "A"-"A" shown in FIG. 13C), including a slotted electrical connection rail 1390 adapted to mate with edge contacts 1381A-1381B of a raised features and emitter support element 1360A FIG. 13C. The electrical conduction rail 1390 defines multiple slots 1395, including one slot 1395 for each raised feature and emitter support element 1360A-1360X of the lighting device 1200. Each slot 1395 includes multiple electrical contacts 1391A-1391B arranged for electrical communication with the corresponding edge contacts 1381A-1381B of a raised feature and emitter support element 1360A-1360X. Conductive thermal communication between each raised feature and emitter support element 1360A-1360X and the elongated heatsink body 1320 is made by insertion of a lower end portion 1368 of each raised feature and emitter support element 1360A-1360X into a corresponding recess or slot defined in the elongated heatsink body 1320, and conductive electrical communication with the solid state light emitters 1340A-1340X is established by mating the electrical conduction rail 1390 with the edge contacts 1381A-1381B of each raised feature and emitter support element 1360A-1360X. FIG. 13E is a front cross-sectional view of an assembled portion of the lighting device 1300 according to FIGS. 13C-13D (taken along section line "A"-"A" shown in FIG. 13C), depicting a raised feature and emitter support element 1360A inserted into a recess of the elongated heatsink 1320 and depicting the slotted electrical connection rail 1390 arranged in mating relationship with edge contacts 1381A-1381B of the raised feature and emitter support element 1360A.

FIGS. 14A-14C relate to a solid state lighting device including a raised feature and solid state light emitter support element including electrical connections formed along an faces thereof, for mating with at least one electrical conductor arranged in or on an elongated heatsink element. Both thermally conductive and electrically conductive connections between a raised feature and solid state light emitter support element 1460 may be made simultaneously via a single step of inserting a raised feature and solid state light emitter support element 1460 into a compound recess (including recess portions 1408, 1409) defined in the elongated heatsink 1420.

FIG. 14A illustrates a raised feature and solid state light emitter support element 1460 prior to bending of a portion thereof, with the element 1460 being arranged for insertion into a compound recess of an elongated heatsink (e.g., heatsink 1420 as shown in FIG. 14C). A blank portion of the raised feature and solid state light emitter support element 1460 may be formed by stamping. A major surface portion 1461 may be fabricated of metal, with an electrically insulating material 1470 provided over at least one surface portion thereof. A first conductive trace 1482A extend between a front face contact 1481A and a first electrical bond pad 1483A (to which a first wirebond or other connection 1484A to a solid state light emitter 1440 may be made). A second conductive trace 1482B extends between a second electrical bond pad 1483B (for making a second wirebond or other connection 1484B to the solid state light emitter 1440) and an edge trace 1485 in electrical communication with a rear face contact 1481B arranged over a rear surface (preferably including a corresponding electrically insulating layer portion) of the raised feature and solid state light emitter support element 1460. The solid state light emitter 1440 is arranged over an emitter support portion 1462-2 and is in thermal communication therewith and with an associated a tab portion 1462-1 of the emitter support element 1462-2. A lower portion 1468 of the raised feature and solid state light emitter support element 1460 is arranged for insertion into a recess of an elongated heatsink (such as heatsink 1420 shown in FIG. 14C).

FIG. 14B is a side elevation view of a raised feature and support element 1460 according to FIG. 14A, following bending of a tab portion 1461-1 thereof to form first and second bends to provide an emitter support surface portion 1461-2 arranged to support the solid state emitter 1440 substantially perpendicular to the major surface portion 1461, with the raised feature and support element 1460 arranged for insertion into a compound recess (including recess portions 1408, 1409) formed in an elongated heatsink 1420. The elongated heatsink includes at least one electrical conductor 1406 arranged therein, with an electrically insulating materials 1405, 1407 preventing conductive electrical communication between the electrical conductor 1406 and the body of the elongated heatsink 1420. In one embodiment, the electrical conductor comprises copper, the body of the elongated heatsink 1420 comprises aluminum, and the electrically insulating materials comprise one or more of polymeric materials, ceramic materials, and adhesives (including epoxies). A lower recess portion 1408 exhibits reduced width and is arranged to form conductive thermal contact with an end portion 1468 of the raised feature and support element 1460 upon insertion of the end portion 1468 therein. Formation of the electrically insulating material 1470 (e.g., as a thin layer)

over the major surface portion 1461 increases the resulting thickness thereof, so that upper recess portion 1409 exhibits increased width to receive a portion of the raised feature and support element 1460 including the front and rear contacts 1481A-1481B. In this manner, both thermally conductive and electrically conductive connections between the raised feature and solid state light emitter support element 1460 may be made simultaneously via a single step of inserting the raised feature and solid state light emitter support element 1460 into the compound recess including recess portions 1408-1409.

FIG. 14C is a side cross-sectional view of an assembled portion of a lighting device including the elements depicted in FIG. 14B, including multiple raised feature and solid state light emitter support elements 1460A-1460X received in corresponding compound recesses formed in the elongated heatsink 1420.

It is to be appreciated that any of the elements and features described herein may be combined with any one or more other elements and features.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A lighting device comprising a plurality of solid state light emitters in conductive thermal communication with a device-scale heatsink including at least a portion of a rod or tube having a length extending in a longitudinal direction and having a width extending in a lateral direction, wherein:
   the length is at least about five times the width;
   the device-scale heatsink includes a plurality of raised features; and
   each raised feature of the plurality of raised features includes a major surface arranged non-parallel to the longitudinal direction;
   wherein the lighting device comprises a plurality of emitter support elements defining the plurality of raised features and arranged to support the plurality of solid state light emitters, wherein the plurality of emitter support elements are arranged in conductive thermal communication with the device-scale heatsink, and wherein at least a portion of each raised feature comprises a printed circuit board.

2. The lighting device of claim 1, wherein the length is at least about ten times the width.

3. The lighting device of claim 1, wherein each raised feature of the plurality of raised features includes a major surface arranged along at least one plane substantially perpendicular to the longitudinal direction.

4. The lighting device of claim 3, wherein the at least one plane comprises multiple planes, and each raised features of the plurality of raised features includes a major surface arranged along a different plane of the multiple planes.

5. The lighting device of claim 1, wherein the device-scale heatsink comprises at least a portion of a threaded rod or tube.

6. The lighting device of claim 1, comprising at least one emitter support surface devoid of said raised features and arranged to support at least some solid state light emitters of the plurality of solid state light emitters.

7. The lighting device of claim 1, wherein the device-scale heatsink comprises a first emitter support surface and comprising a second emitter support surface that is non-coplanar with the first emitter support surface, wherein each of the first and the second emitter support surface supports and is in conductive thermal communication with multiple solid state light emitters of the plurality of solid state light emitters.

8. The lighting device of claim 1, wherein the plurality of solid state emitters is arranged relative to the device scale heatsink to prevent direct illumination of the plurality of raised features by the plurality of solid state emitters.

9. The lighting device of claim 1, comprising a plurality of emitter support elements defining the plurality of raised features and arranged to support the plurality of solid state light emitters, wherein the plurality of emitter support elements are arranged in conductive thermal communication with the device-scale heatsink.

10. The lighting device of claim 9, further comprising at least one electrical conductor extending to or between each emitter support element of the plurality of emitter support elements.

11. The lighting device of claim 9, wherein the device scale-heatsink comprises a plurality of recesses, and the plurality of emitter support elements is inserted into the plurality of recesses.

12. The lighting device of claim 9, wherein each emitter support element of the plurality of emitter support elements comprises at least one electrically conductive trace in electrical communication with at least one solid state light emitter of the plurality of solid state light emitters and in electrical communication with at least one electrical conductor arranged to conduct current to the at least one solid state light emitter.

13. The lighting device of claim 12, wherein the at least one electrical conductor extends through an interior of the device-scale heatsink.

14. The lighting device of claim 12, wherein the at least one electrical conductor is physically separated from the device-scale heatsink.

15. The lighting device of claim 12, wherein each emitter support element comprises an edge contact arranged to interface with the at least one electrical conductor.

16. The lighting device of claim 9, wherein each emitter support element comprises stamped metal with at least one bend arranged between (i) a major surface defined by the emitter support element and (ii) an emitter mounting region on the emitter support element.

17. The lighting device of claim 9, wherein each emitter support element is electrically isolated from the plurality of solid state light emitters.

18. The lighting device of claim 9, wherein each emitter support element comprises stamped metal with an electrically insulating material arranged on at least one surface thereof.

19. The lighting device of claim 9, wherein at least a portion of each emitter support element is arranged to receive direct light emissions from at least one solid state light emitter of the plurality of solid state light emitters.

20. The lighting device of claim 9, comprising a brazed, soldered, or welded connection permitting conductive thermal communication between each emitter support element and the device-scale heatsink.

21. The lighting device of claim 9, wherein each emitter support element has a maximum dimension that is no greater than about two times the width of the device-scale heatsink.

22. The lighting device of claim 1, adapted to generate white light emissions.

23. The lighting device of claim 1, wherein at least some solid state light emitters of the plurality of solid state light emitters are connected in parallel to a control circuit and are independently controllable.

24. The lighting device of claim 1, wherein the plurality of solid state light emitters comprises a first group of solid state light emitters connected in series, and a second group of solid state light emitters connected in series, wherein the first group of solid state light emitters and the second group of solid state light emitters are independently controllable.

25. The lighting device of claim 1, operatively connected to at least one sensor, wherein operation of the lighting device is controlled responsive to an output signal of the sensor.

26. The lighting device of claim 1, having a luminous efficiency of at least about 100 lumens per watt.

27. The lighting device of claim 26, having a color rendering index of at least 90.

28. The lighting device of claim 1, further comprising a diffuser arranged to receive and diffuse emissions from the plurality of solid state light emitters.

29. A light fixture comprising the lighting device according to claim 1.

30. The lighting device of claim 1, wherein:
each raised feature of the plurality of raised features has a maximum dimension that is no greater than about two times the width of the device-scale heatsink.

31. The lighting device of claim 30, wherein the length is at least about ten times the width.

32. The lighting device of claim 30, wherein each raised feature of the plurality of raised feature is spaced apart in a longitudinal direction from an adjacent raised feature to provide an air gap permitting ventilation between each raised feature and the adjacent raised feature.

33. A method for fabricating a lighting device, the method comprising mounting a plurality of solid state light emitters in conductive thermal communication with a plurality of emitter support elements defining a plurality of raised features and joining the plurality of emitter support elements in conductive thermal communication with a device-scale heatsink including at least a portion of a rod or tube having a length extending in a longitudinal direction and having a width extending in a lateral direction, wherein the length is at least about five times the width, wherein each raised feature includes a major surface arranged non-parallel to the longitudinal direction, wherein each raised feature of the plurality of raised features includes a major surface arranged non-parallel to the longitudinal direction, and wherein at least a portion of each raised feature comprises a printed circuit board.

34. The method of claim 33, wherein the length is at least about ten times the width.

35. The method of claim 33, wherein each major surface is arranged along at least one plane substantially perpendicular to the longitudinal direction.

36. The method of claim 33, further comprising defining a plurality of recesses in the device-scale heatsink, wherein the joining of the plurality of emitter support elements in conductive thermal communication with a device-scale heatsink includes inserting portions of the emitter support elements in the plurality of recesses.

37. The method of claim 33, further comprising forming the plurality of emitter support elements by steps including stamping emitter support element blanks, and bending or shaping at least a portion of each emitter support element blanks into a non-planar configuration.

\* \* \* \* \*